10/17/78 XR 4,121,203

United States Patent [19] [11] 4,121,203
Edwards et al. [45] Oct. 17, 1978

[54] METHOD OF MULTIPLEXING LIQUID CRYSTAL DISPLAYS

[75] Inventors: Wales Dale Edwards, Satellite Beach; William Harold White, Indialantic, both of Fla.

[73] Assignee: Harris Corporation, Cleveland, Ohio

[21] Appl. No.: 776,818

[22] Filed: Mar. 11, 1977

[51] Int. Cl.² .......................... G02F 1/13; H03K 1/12
[52] U.S. Cl. .................................... 340/336; 307/209; 307/262; 307/270; 350/332
[58] Field of Search ................. 340/336; 350/160 LC, 350/332; 307/262, 270, 205, 209; 328/57

[56] References Cited

U.S. PATENT DOCUMENTS

| | | | |
|---|---|---|---|
| 3,896,430 | 7/1975 | Hatsukano | 340/336 |
| 3,936,676 | 2/1976 | Fujita | 340/336 X |
| 3,949,242 | 4/1976 | Hirasawa et al. | 340/336 X |
| 3,995,942 | 12/1976 | Kawakami et al. | 340/336 X |
| 4,050,064 | 9/1977 | Hashimoto et al. | 340/336 X |

*Primary Examiner*—David L. Trafton
*Attorney, Agent, or Firm*—Leitner, Palan, Martin & Bernstein

[57] ABSTRACT

A liquid crystal display is multiplexed by the digit input being driven between a first and second voltage level and the segment input being driven between the second and a third voltage level. The difference between the first and third voltage level is sufficient to activate the liquid crystal device. For AC liquid crystal displays, a polarity reversal circuit, driven by a low frequency signal, is included for both the digit input and the segment input to cause the digit input to vary between the second and third voltage level while the segment input varies between the first and second voltage level.

4 Claims, 5 Drawing Figures

DIGIT

SEGMENT

METHOD OF MULTIPLEXING LIQUID CRYSTAL DISPLAYS

BACKGROUND OF THE INVENTION

1. Field of the Invention

The present invention relates generally to liquid crystal displays and more specifically to a method and apparatus of multiplexing liquid crystal displays.

2. Description of the Prior Art

The use of low power liquid crystal display elements in, for example, portable calculators, watches, etc., is desirable since these environments generally use batteries and consequently the life of a battery is extended. Similarly, the circuit elements needed to drive the liquid crystal display reduces the overall size of the integrated circuit. One of the problems encountered with a liquid crystal display, versus light emitting diodes, is that the liquid crystal display is a bidirectional element and consequently unselected segments may be activated for a given digit because of the bidirectionality of the liquid crystal device.

Liquid crystal devices are generally on for a voltage differential of V1 across it and are completely off for a voltage differential below a voltage V2 across it. In order for the segment to be completely off, it must have less than V2 across it. If the segment data input changes from zero for segment off to V1 for segment on, extraneous paths can be set up from the V1 of an on segment to the zero of an off segment of the same digit and consequently activate the nonselected digit. Other multiplexing schemes which multiplex the digits and the segments by varying the voltage on the digit input and the segment input between zero and V1 in the opposite direction so as to produce a voltage V1 thereacross, have the same problem. Namely, the extraneous paths are set up such that unselected elements are activated. For other multiplexed displays having a plurality of digits with the corresponding segments connected to a common drive, the difference between the segment non-drive voltage and the digit non-select voltage is not sufficiently low to turn off a segment activated in a previously selected digit and also activated in the next digit.

It has also been noted as a problem by the prior art that DC multiplexing schemes of AC-type liquid crystal displays shorten the life of the display element because of chemical plating action which occurs. Prior art attempts at solving this problem have included complicated current reversal circuits on either the digit or segment drive. Similarly, circuits involving reversal circuit in both the segment and digit input have not recognized the problem discussed in the previous paragraph concerning the extraneous path set up by using a reversal of zero and V1 voltage levels.

Thus there exists a need to provide a multiplexing scheme which will end the extraneous conduction paths for liquid crystal displays and a polarity reversal scheme which will prevent plating in AC liquid crystal displays and also prevent the formation of the extraneous current path.

SUMMARY OF THE INVENTION

The multiplexing scheme of the present invention drives the digit with a signal varying between a first voltage level and a second voltage level while the segment is driven by a signal varying between the second and a third voltage level. The difference between the first and third voltage level is sufficient to activate the liquid crystal device and the difference between the first and second and between the second and third are insufficient to activate the liquid crystal device and are below the off voltage level of the liquid crystal device. The selected segment for a selected digit is activated by the segment being driven by a third voltage level signal while the digit being driven by the first voltage level signal and the unselected segments of the activated digit are driven by the second voltage level signal. Consequently, the unselected segments will not turn on and will be extinquished if previously activated since the maximum voltage thereacross is the difference between the second and first or second and third voltage levels.

For AC liquid crystal displays a polarity reversal circuit, driven by a low frequency signal, is included for both the digit input and the segment input to cause the digit input to vary between the second and third voltage level while the segment input varies between the first and second voltage level. The polarity reversal circuit includes a P channel field effect transistor connecting the second voltage level signal to the output, a P channel field effect transistor connecting the first voltage signal to the output and an N channel field effect transistor connecting the third voltage level signal to the output. An inverter, a NOR gate and a NAND gate interconnect the select input, be it the segment select or the digit select, with a low frequency signal so as to activate alternatively the first P channel FET and the N channel FET during a first portion of a cycle of the low frequency input and to alternate the activation of the two P channel devices for a second portion of the low frequency input. The low frequency input for the segment polarity reversal circuit is 180 degrees out of phase with the low frequency input of the digit polarity reversal cirucit so as to achieve the alternate reversals of the segment and digital drive signals. The low frequency signals are substantially lower than the strobe signal of the digit drive.

OBJECTS OF THE INVENTION

An object of the present invention is to provide an improved multiplexing system for liquid crystal displays.

Another object is to provide multiplex system for liquid crystal displays reducing the extraneous current paths.

A further object of the invention is to provide an improved polarity reversal system for AC liquid crystal displays Still another object is to provide a multiplex system with a polarity reversal circuit which eliminates extraneous current paths capable of activating unselected crystal elements.

Still a further object of the invention is to extend the life of a liquid crystal display and to minimize the power requirements of the circuit.

An even further object of the invention is to provide a simple multiplexing scheme and polarity reversal circuit which is adaptable for use in existing environments without major modification.

Other objects, advantages and novel features of the present invention will become apparent from the following detailed description of the invention when considered in conjunction with the accompanying drawings.

DESCRIPTION OF THE PREFERRED EMBODIMENTS

Figure 1:
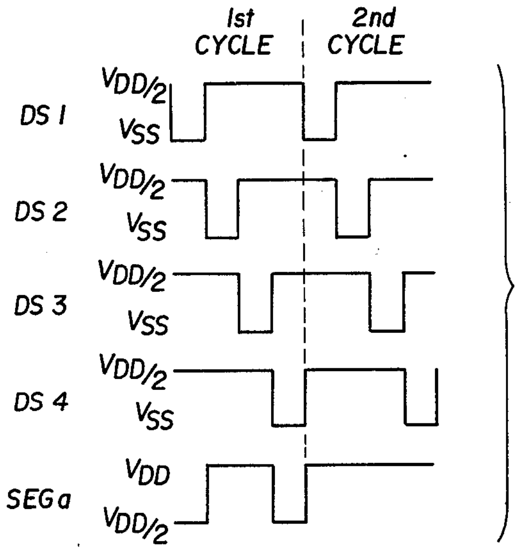
FIG. 1 is a series of graphs of the signals representing a multiplexing scheme embodying the principles of the present invention.

As illustrated in FIG. 1, the multiplexing system of the present invention consists of four digit signals DS1 through DS4 comprising one complete strobe cycles and varying between $V_{SS}$ (which may be zero) and $V_{DD/2}$ and the segment drive signals varies between $V_{DD/2}$ and $V_{DD}$. In the example illustrated in FIG. 1, segment "*a*" has a voltage of $V_{DD/2}$ during digital strobes DS1 and DS4 and a value of $V_{DD}$ during digital strobe DS2 and DS3. During the stroke pulse of signal DS1 for the first digit, DS1 is at $V_{SS}$ and segment "*a*" is at $V_{DD/2}$. During the strobe signals for digits two and three, digital strobe signal DS1 is at $V_{DD/2}$ and segment "*a*" signal is at $V_{DD}$, therefor, during the stobe of digits two and three, the voltage across the segments for digit one is still $V_{DD/2}$. During the strobe pulse for digit four, the voltage across segment "*a*" of digit one is zero, since the segment "*a*" signal and the DS1 signal are both at $V_{DD/2}$. Thus, during cycle one of the DS1 signal for digit one, the voltage across segment "*a*" never exceeds $V_{DD/2}$, which is below the turn-on and the turn-off voltage of the liquid crystal display. Similarly, since segment *b, c, d, e, f, g,* of a seven segment display, and *h, j,* of a nine segment display are varying between $V_{DD/2}$ and $V_{DD}$, the voltage across the segments assuming conduction between segments between signals is still $V_{DD/2}$ and consequently below the on voltage of a liquid crystal device for the segment.

For the digit strobe signals DS2 and DS3, in the second and third quarter of cycle one respectively, the difference between the digit strobe pulse and the segment "*a*" pulse is $V_{DD}$ and consequently segment "*a*" for digits two and three will be on. During the strobe pulse for digit four, illustrated at DS4, the segment "*a*" is at $V_{DD/2}$ and consequently the voltage impressed across the segment "*a*" during digit strobe pulse four, is $V_{DD/2}$ and it is not turned on. During cycle two illustrated in FIG. 1, since segment "*a*" is at $V_{DD}$ for the complete cycle, segment "*a*" is on for each of the strobe pulses, or digits one through four as illustrated in graphs DS1 through DS4.

Thus the multiplexing scheme of the present invention as illustrated in FIG. 1 has digit strobe pulses DS1 through DS4 varying between the first voltage level, for example $V_{SS}$ or zero and a second voltage level, for example $V_{DD/2}$ while the segment drive signals vary between the second voltage level, for example $V_{DD/2}$ and a third voltage level $V_{DD}$. While the difference between the first voltage level $V_{SS}$ and a third voltage level $V_{DD}$ is $V_{DD}$ and is sufficient to activate a segment of the liquid crystal device, the difference between the first and second voltage levels $V_{SS}$ and $V_{DD/2}$ and between the second and third voltage levels $V_{DD/2}$ and $V_{DD}$ is $V_{DD/2}$, which is below the on voltage of the liquid crystal segment. A segment can only be activated when the segment assumes a third voltage level $V_{DD}$ and the digit strobe for that digit assumes the first voltage level $V_{SS}$ or zero. The extraneous current path which is capable of activating liquid crystal displays in prior art devices by conducting between a low signal of an off segment and a high signal of an on segment is eleminated in the present multiplexing system because the voltage level difference will be $V_{DD/2}$ which is below the on level of the liquid crystal device. Also previously activated segments are extinguished since $V_{DD/2}$ is also below the off voltage of the liquid crystal device. Consequently, by having the segments vary between a second and third voltage, which is below the on and off voltages of a liquid crystal display, only the selected segments are activated.

Figure 2:
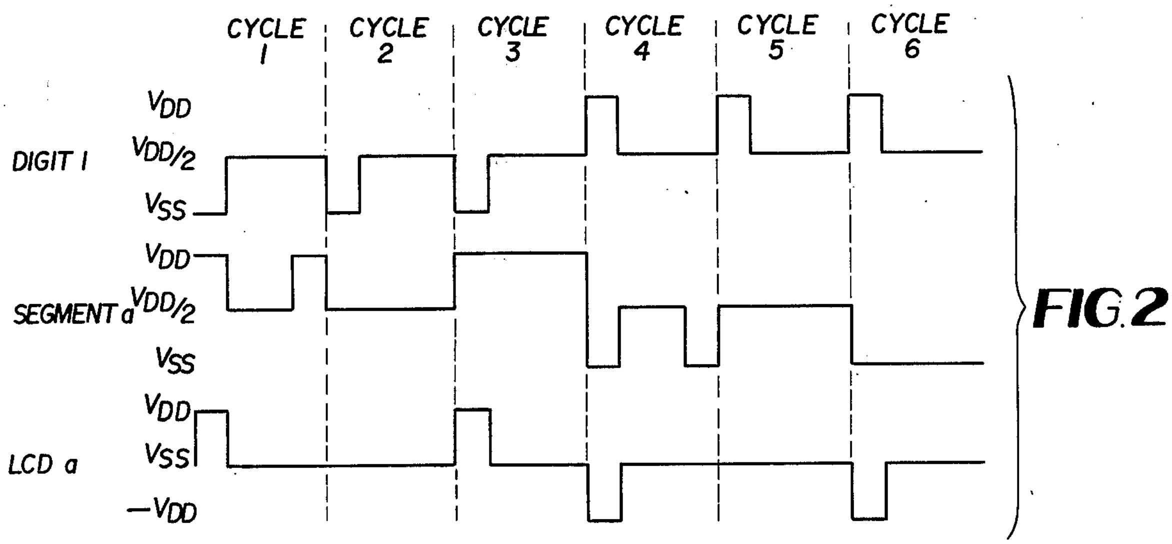
FIG. 2 is a graphical representation of relationship of the digit and segment drive signals and the voltage across an AC liquid crystal device.

The present multiplex scheme described in FIG. 1 works very well in liquid crystal displays built for DC operation, but as is well known in the prior art, pressing a unipolar DC signal across a liquid crystal display constructed for AC operation shortens the life of the display because of chemical plating action. As recognized by the prior art, it is desirable to alternate the direction of the DC signal applied across the AC liquid crystal display to prevent this deterioration. The multiplex scheme of FIG. 1 is converted for use with AC liquid crystal displays as illustrated in FIG. 2. The basic concept of having the digit strobe or drive signal varying between two signals whose difference are $V_{DD/2}$ and the segment drive signal varying between two voltages whose differences are $V_{DD/2}$ and the difference of the noncommon voltage level for the digit drive signal and the segment drive signal is $V_{DD}$ is retained.

During the first three cycles, the digit strobe or drive signal varies between $V_{SS}$ and $V_{DD/2}$ and the segment drive signal varies between $V_{DD/2}$ and $V_{DD}$, which is the same scheme illustrated in FIG. 1. In the next three cycles, namely, cycles four, five, and six illustrated in FIG. 2, the digit strobe or drive signal varies between $V_{DD/2}$ and $V_{DD}$ while the segment drive varies between $V_{DD/2}$ and $V_{SS}$. This is the complementary or inverse relationship to that of the first three cycles. As noted in the third curve or the LDC "*a*" curve in FIG. 2, the voltage across liquid crystal device for segment "*a*" during digit strobe one is $V_{DD}$ for cycles one and three and is $-V_{DD}$ for cycles four and six. Thus it can be seen that the direction of voltage across a liquid crystal display using the digit as the reference, is alternated every three cycles. As will be explained more fully in the description of FIG. 3, the number of cycles of the digit strobe which are included at one polarity level is approximately one half the period of a low frequency alternating signal. The use of three cycles is but a mere example and may be increased or decreased depending upon the characteristics of a liquid crystal display.

To produce the wave forms shown in FIG. 2, a pair of polarity reversal circuits are provided between the liquid crystal device and the digital strobe or drive signal and the segment drive signal. The circuit for the polarity reverse means is illustrated in FIG. 3.

Polarity reversal circuit 10 includes a first switching element, illustrated as a P channel field effect transistor, 12 for connecting the voltage signal $V_{DD/2}$ to the output terminal 14, a second switching element 16 illustrated as a P channel field effect transistor connecting the voltage $V_{DD}$ to the output terminal 14 and a third switching element 18 illustrated as a N channel field effect transistor connecting the voltage level $V_{SS}$ to the output 14. The drive signal, be it the digit strobe or drive signal or the segment drive signal is applied at input 20 and a low frequency alternating signal is applied at input 22.

The drive signal input 20 is connected to a gate of switch 12 through inverter 24. The output of inverter 24 is also combined with the signal at the alternating signal input 22 in NAND gate 26 whose output is connected to gate of switch 16. The drive signal at input 20 and the alternating signal at input 22 are combined in NOR gate 28 whose output is connected to the gate of switch 18. The logic of inverter 24 and gates 26 and 28 control the switches 12, 16, and 18 such that the signal at output 14 is between either $V_{DD/2}$ and $V_{SS}$ or $V_{DD/2}$ and $V_{DD}$. The alternating signal input at input 22 for the polarity reversal circuit 10 for the digit strobe or drive signal is 180° out of phase from the alternating signal applied to input 22 of the polarity reversal circuit 10 for the segment drive signal.

Figure 3:
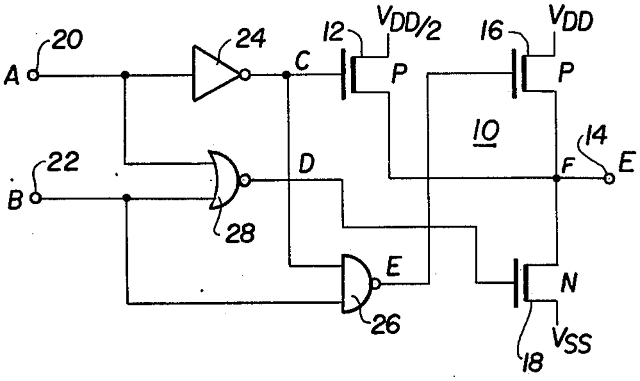
FIG. 3 is a schematic of a polarity reversal circuit embodying the principles of the present invention.
Figure 4:
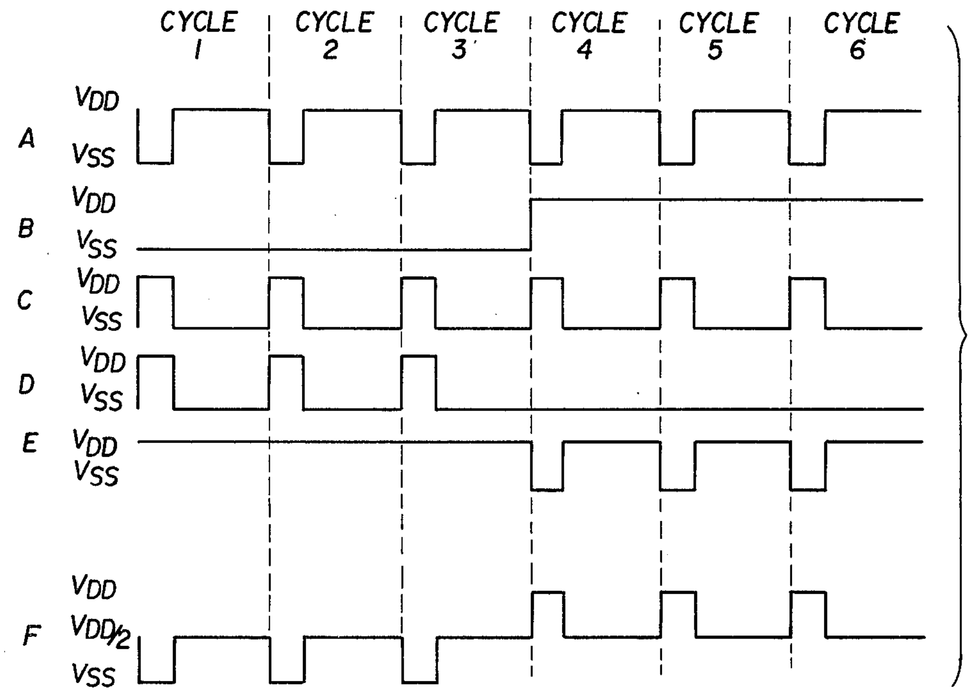
FIG. 4 is a graphical representation of the signals at various points in the polarity reversal circuit of FIG. 3.
Figure 5:
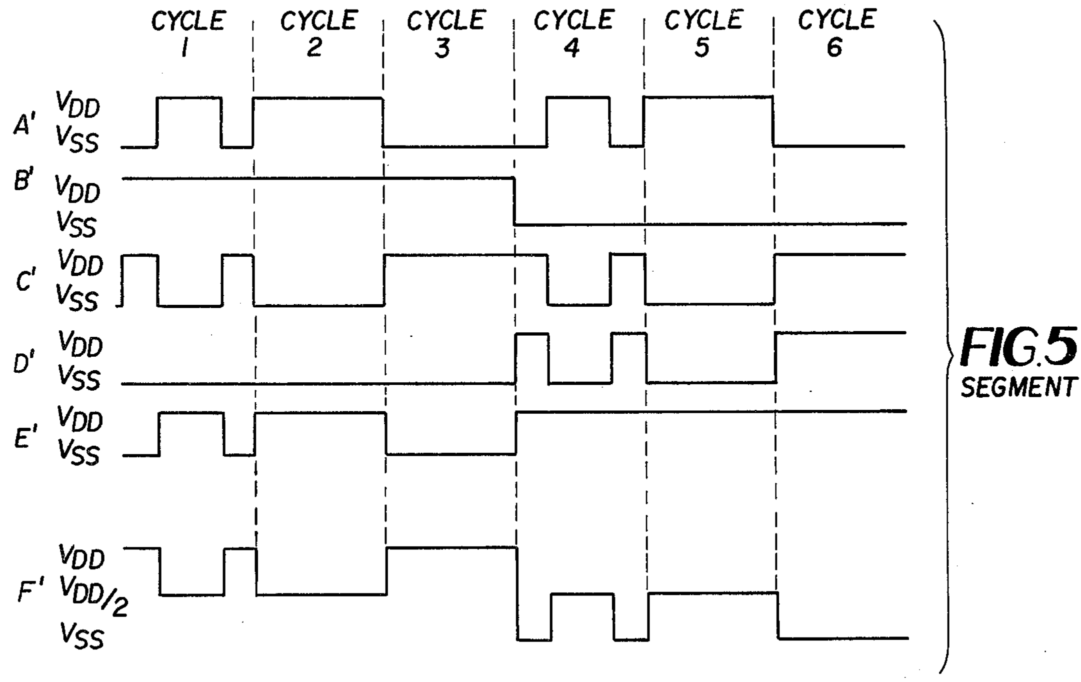
FIG. 5 is a graphical representation of the signals at various points in the polarity reversal circuits of FIG. 3 for the other member of a pair of circuits.

To further understand the operation of FIG. 3 of the polarity reversal circuit 10 of FIG. 3 and its use of a pair of such circuits to produce the results of FIG. 2, reference is herein made to graphs of FIGS. 4 and 5.

FIG. 4 illustrates the signals at various points of the polarity reversal circuit 10 of FIG. 3 for the digit strobe or drive signal. The input digit strobe or drive signal is illustrated as curve A at input 20 wherein the digit drive signal varies between $V_{DD}$ and $V_{SS}$ for approximately one quarter of each of the six cycles. The low frequency alternating signal B at input 22 is low for three cycles and is high for three cycles. Signal C at the output of inverter 24 is the inverse of the digit drive signal A.

The input signals A and B are combined at NOR gate 28 to provide the signal D which is high for each digit strobe or drive signal for the first half of the alternating current signal B or three cycles of the strobe and low for the remaining half of the low frequency signal B or the next three cycles of the digit strobe. The inverted digit input signal C is combined with the low frequency alternating signal B at NAND gate 26 to produce the signal E, being low for the first half of the cycle of the alternating current signal B and following basically the input signal A for the other half of the alternating cycle. The inverted digit input signal C is used to drive gate 12. Gate 12 causes the output signal F to be pulled to $V_{DD/2}$ when signal C is low. When signal C is high, gate 12 is off and has no effect on the output signal F.

The output signal F appearing at output 14 during the first three strobe cycles or half of the alternating signal B cycle, varies between $V_{SS}$ and $V_{DD/2}$ based on the gating of switch 12 and 18 by signals C and D respectively. When the input signal A becomes low for the digit strobe or drive, signal C becomes high which turns off switch 12 and makes it inactive. During the same digit strobe or drive signal, signal D becomes high turning on switch 18 and connecting output 14 to $V_{SS}$ which is ground. During the remainder of the cycle, which allows the other four digits to be strobed, the operation is reversed with the signal C becoming low, turning on switch 12 which places $V_{DD/2}$ at the output 14 and signal D becomes low, unclamping the output from $V_{SS}$. The next two cycles of the strobe signal are the same as the first cycle during the first half of the cycle of the alternating signal B.

During the fourth, fifth, and sixth strobe cycle, which comprise the other half of the cycle of the alternating signal B, signal C is the same as during the previous three cycles driving switch 12 so as to keep switch 12 off during the digit strobe or drive signal and turn it on so as to place signal $V_{DD/2}$ at the output 14 of signal of during the remainder of the strobe cycle. During these next three cycles, signal D remains low consequently preventing switch 18 from being activated. During cycles 4, 5, and 6, the output E of NAND gate 26 is low during the digit strobe or drive signal and is high at all other times. When the signal E is low it turns on switch 16 which places the voltage $V_{DD}$ on the output 14 as signal F. During the remainder of the strobe cycle, signal E is high, isolating the signal $V_{DD}$ from the output and the signal $V_{DD/2}$ is applied to the output 14. Thus it can be seen that during the first half of the cycle of the alternating signal B, the output F varies between the voltage levels $V_{SS}$ and $V_{DD/2}$ and during the second half of the cycle, the alternating signal B, the output F varies between the voltage levels $V_{DD}$ and $V_{DD/2}$.

FIG. 5 illustrates the signal of the polarity reverse circuit 10 for the segment drive corresponding to the cycles one through six of the digit drive signal as illustrated in FIG. 4. The digit drive signal A′ is low for digits one and four and high for digits two and three for the first cycle, high for all four digits during the second cycle, and low for all four digits for the third cycle. The cycles one, two, and three are repeated as cycles four, five and six for purposes of illustration.

As noted previously, the alternating signal B′ at input 22 for the segment polarity reversal circuit is the inverse of the signal B or 180 degrees out of phase and is high for the first three cycles and low during the second three cycles. Signal C′ is the inverse of signal A′. Signal D′, which is the output of gate 28, is low during the first half of the alternating signal B′ and is high and low as the signal at A′ is low and high, respectively. Signal E′ follows signal A′ during the first half of the alternating signal B′ and remains high during the second half of the alternating signal B′.

Signal C′ drives the gate of switch 12 to cause the output signal F′ to be pulled to $V_{DD/2}$ when signal C′ is low ($V_{SS}$). When signal C′ is high ($V_{DD}$), switch 12 is off and the level of output signal F′ is controlled by switch 16 or switch 18. half of the alternating signal B′ and varies between $V_{SS}$ and $V_{DD/2}$ during the second half of the alternating signal. Thus the output signal F′ for the segment drive signal is at $V_{DD}$ during the first and fourth digit strobe signals during the first cycle and at $V_{DD/2}$ for the total second cycle and at $V_{DD}$ for the total third cycle.

During the second half of the period of the alternating signal B′, the signal F′ varies between $V_{DD/2}$ and $V_{SS}$. The fourth, fifth, and sixth cycles equal cycles one, two and three except that wherein the signal in cycles one, two and three is at $V_{DD}$, at cycles four, five, and six it is at $V_{SS}$. To be more specific, in cycle four, the signal F′ is at $V_{SS}$ at strobe digital segments one and four and for the total sixth cycle. For the fifth cycle and the digital strobe signals for digits two and three of the fourth cycle the signal F′ is at $V_{DD/2}$.

The use of the output signals F for the digit drive and the output F′ for the segment drive was illustrated and discussed in FIG. 2. To recapitulate, the liquid crystal device for segment "*a*" in the first digit is on having a voltage $V_{DD}$ impressed thereacross for cycles one and three at a first polarity and is on having a voltage $V_{DD}$ impressed thereacross in cycles four, and six in the reversed polarity. The output signals F and F' of the polarity reversal circuit 10 which is used to drive the digit and segment portions respectively employ the multiplexing technique of FIG. 1 wherein the digit drive signal and the segment drive signal each vary between voltage levels having a difference less than the on voltage requirement for a liquid crystal display. The alternation of the signals in FIGS. 4 and 5 are to extend the life of the crystal life by preventing plating.

The selection of voltages for $V_{SS}$ as zero and the common second level being $V_{DD/2}$ is but one design choice of the present invention. Segment "*a*" may vary between a voltage V1 and V2 while the digit strobes vary between the voltage V3 and V4. The requirement of the multiplexing system of the present invention is mainly that the difference between V1 and V2, between V3 and V4, between V2 and V4 and between V1 and V3 be less than the turn-on voltage of the liquid crystal device. To guarantee that previously activated segments are extinguished, these differences may also be less than the turn off voltage of the liquid crystal display. This result is attained by making the voltages V1, V2, and V3 and V4 either progressively small or progressively larger than each other and that the difference between V1 and V4 be sufficient to turn on the liquid crystal display. In order to apply this multiplexing system to an AC crystal device, a polarity reversal circuit device must be included in each drive for the segments and the digits.

From the preceding description of the preferred emobodiments, it is evident that the objects of the invention are obtained. Although the invention has been described and illustrated in detail, it is to be clearly understood that the same is by way of illustration and example only and is not to be taken by way of limitation; the spirit and scope of this invention is to be limited only by the appended claims.

What is claimed is:

1. A circuit for alternating a data signal from between a first and second voltage level to between a second and third voltage level at an output comprising:
- a data input,
- an alternating signal input,
- a first switch means for providing said first voltage level at said output,
- a second switch means for providing said second voltage level at said output,
- a third switch means for providing said third voltage level at said output,
- an inverter means between said data input and said second switch means,
- a NOR gate means for receiving said data and alternating signal inputs and producing an output coupled to said third switch means, and
- a NAND gate means for receiving said alternating signal input and the output of said inverter and producing an output coоupled to said first switch means.

2. The circuit of claim 1 wherein said first and second switch means are P channel field effect transistors and said third switch means is an N channel field effect transistor.

3. In a liquid display having a digit drive signal varying between a first and second voltage level and a segment drive signal varying between said second voltage level and a third voltage level and polarity reversal means for periodically producing a reversal of current flow through the liquid crystal display, the improvement comprising:
- a pair of polarity reversal logic means, one for producing a digit drive signal which periodically varies between said first and second voltage levels and said second and third voltage levels, and one for producing a segment drive signal which periodically varies between said second and third voltage levels and said first and second voltage levels in coincidence with the variation of said digit drive signal, each of said polarity reversal logic means including a first input for receiving an alternating periodic signal, second, third and fourth inputs for receiving said first, second and third voltage levels respectively and a fifth input for receiving a select signal, first switch means for connecting said first voltage level input to the output of said polarity reversal logic means, a second switch means for connecting said second voltage level input to said polarity reversal logic means output, third switch means for connecting said third voltage level input to said polarity reversal logic means output, an inverter means connected between said select signal input and said second switch means, a NOR gate having first and second inputs connected, respectively, to said select signal input and said alternating signal input and an output connected to said third switch means, a NAND gate having first and second inputs connected, respectively, to said alternating signal input and the output of said inverter means and having an output connected to said first switch means.

4. A circuit for causing a data signal to periodically reverse polarity comprising:
- a data input,
- an alternating signal input,
- a first P channel field effect transistor means for providing a first voltage level at said output,
- a second P channel field effect transistor means for providing a second voltage level at said output,
- a third N channel field effect transistor means for providing third voltage level at said output, the difference between said second and third voltage levels being equal in magnitude and difference between said first and second voltages but opposite in polarity,
- an inverter means connected between said data input and said second transistor means,
- a NOR gate the inputs of which are connected to receive said data and alternating signal inputs, the output of said NOR gate being connected to said third transistor means, and
- a NAND gate the inputs of which are connected to receive said alternating signal input and the output of said inverter, the output of said NAND gate being connected to said first transistor means.

* * * * *

UNITED STATES PATENT AND TRADEMARK OFFICE

CERTIFICATE OF CORRECTION

PATENT NO. : 4,121,203

DATED : Oct. 17, 1978

INVENTOR(S) : Wales Dale Edwards, William Harold White

It is certified that error appears in the above-identified patent and that said Letters Patent are hereby corrected as shown below:

Column 1, line 16, Delete "reduces" and insert --reduce--.

Column 3, line 22, Delete "cycles" and insert --cycle--.

line 24, Delete "varies" and insert --vary--.

line 32, Delete "therefor" and insert -- therefore--.

line 41, Delete "-ment"" and insert -- ments--.

Column 4, line 11, Delete "elemi-"" and insert --elimi---.

line 33, Delete "are" and insert --is--.

line 37, Delete "is" , first occurrence.

Column 6, line 6, "of", second occurrence should read -- F --.

line 46, After 18. insert --The output signal F' varies between $V_{DD}$ and $V_{DD/2}$ during the first Column 7, line 10, Delete "life", second occurrence.

line 25, Delete "small" and insert --smaller--.

UNITED STATES PATENT OFFICE

CERTIFICATE OF CORRECTION

Patent No. 4,121,203 Dated October 17, 1978

Inventor(s) Wales Dale Edwards, William Harold White

It is certified that error appears in the above-identified patent and that said Letters Patent are hereby corrected as shown below:

Column 7, line 61, "cooupled" should read -- coupled --.

Signed and Sealed this

*Sixth* Day of *March 1979*

[SEAL]

*Attest:*

RUTH C. MASON
*Attesting Officer*

DONALD W. BANNER
*Commissioner of Patents and Trademarks*